(12) United States Patent
Nsalambi et al.

(10) Patent No.: US 11,047,060 B2
(45) Date of Patent: Jun. 29, 2021

(54) ELECTRIC CIRCUIT, ELECTRONIC MODULE FOR A CHIP CARD FORMED ON THE ELECTRIC CIRCUIT, AND METHOD FOR THE PRODUCTION OF SUCH AN ELECTRIC CIRCUIT

(71) Applicant: Linxens Holding, Mantes la Jolie (FR)

(72) Inventors: Hugues Nsalambi, Juziers (FR); Florian Venon, Mantes la Jolie (FR); Jérome Sanson, Osmoy (FR); Guillaume Cardoso, Mantes la Ville (FR)

(73) Assignee: Linxens Holding, Mantes la Jolie (FR)

( * ) Notice: Subject to any disclaimer, the term of this patent is extended or adjusted under 35 U.S.C. 154(b) by 0 days.

(21) Appl. No.: 16/759,994

(22) PCT Filed: Nov. 27, 2018

(86) PCT No.: PCT/FR2018/053011
§ 371 (c)(1),
(2) Date: Apr. 28, 2020

(87) PCT Pub. No.: WO2019/106284
PCT Pub. Date: Jun. 6, 2019

(65) Prior Publication Data
US 2020/0283924 A1    Sep. 10, 2020

(30) Foreign Application Priority Data

Nov. 28, 2017  (FR) ...................................... 1761324

(51) Int. Cl.
*H05K 1/09* (2006.01)
*C25D 5/12* (2006.01)
*C25D 3/56* (2006.01)
*C25D 7/12* (2006.01)
*G06K 19/077* (2006.01)
(Continued)

(52) U.S. Cl.
CPC ............... *C25D 5/12* (2013.01); *C25D 3/567* (2013.01); *C25D 7/12* (2013.01); *G06K 19/07743* (2013.01); *H05K 1/0242* (2013.01); *H05K 1/09* (2013.01); *H05K 3/244* (2013.01)

(58) Field of Classification Search
CPC ............................................... H05K 1/09–097
See application file for complete search history.

(56) References Cited

U.S. PATENT DOCUMENTS 6,259,035 B1   7/2001 Truggelmann et al.
9,576,693 B2 * 2/2017 Shibuya ................... B32B 15/01
(Continued)

FOREIGN PATENT DOCUMENTS

DE   196 25 466 C1   11/1997
EP   2 866 173 A1    4/2015
JP   S5544534 A      3/1980

*Primary Examiner* — Jeremy C Norris
(74) *Attorney, Agent, or Firm* — Harrington & Smith

(57) ABSTRACT

An electrical circuit, for example a printed circuit, for producing a module for integration into a card such as a chip card. This module includes electrical contact or connector which includes lands for the connection and communication of the chip with a read/write system. To give them a white color, or a color close to white, these electrical contact lands are at least partially covered with a layer of a rhodium alloy. The invention also relates to a method for manufacturing such an electrical circuit.

11 Claims, 4 Drawing Sheets

Figure 1:
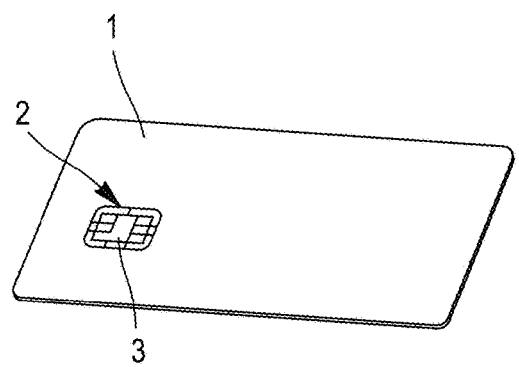

(51) Int. Cl.
*H05K 1/02* (2006.01)
*H05K 3/24* (2006.01)

(56) References Cited

U.S. PATENT DOCUMENTS

2002/0192363 A1 12/2002 Bahn et al. .................. 427/123
2013/0082091 A1* 4/2013 Matejat .................. H01L 24/11
228/176
2017/0245038 A1 8/2017 Chawan et al.

* cited by examiner

ELECTRIC CIRCUIT, ELECTRONIC MODULE FOR A CHIP CARD FORMED ON THE ELECTRIC CIRCUIT, AND METHOD FOR THE PRODUCTION OF SUCH AN ELECTRIC CIRCUIT

CROSS REFERENCE TO RELATED APPLICATION

This patent application is a U.S. National Stage application of International Patent Application Number PCT/FR2018/053011 filed Nov. 27, 2018, which is hereby incorporated by reference in its entirety, and claims priority to FR 1761324 filed Nov. 28, 2017.

The invention relates to the field of electrical circuits.

For example, electrical circuits according to the invention may be printed circuits with conductive tracks and/or electrical contact lands etched into a conductive layer previously deposited on a substrate, or else circuits comprising one or more lead frames, each consisting of a sheet of conductive material cut out and co-laminated with an insulating substrate. Such electrical circuits are used for example for the production of contacts for electronic chip card modules, antennas for chip cards, mixed circuits comprising both contacts and an antenna, etc.

Chip cards have multiple uses: credit cards, SIM cards for cellphones, transport cards, identity cards, etc., and the invention is of particular interest for the production of printed circuits comprising conductive tracks and/or contact lands that are visible on the finished product.

By way of illustration, taking the example of chip cards, these generally consist of a rigid carrier, for example made of plastic, forming the main body of the card, into which a separately manufactured electronic module is incorporated. This electronic module comprises a printed circuit, which is generally flexible, provided with a chip (integrated circuit) and means for connecting the chip to a device allowing data in the chip to be read and/or written. These connection means—or connectors—are for example contacts formed of conductive metal tracks flush with the electronic module, on the surface of the carrier. In addition to the need for the contacts to exhibit excellent mechanical strength and excellent resistance to corrosion, as well as good electrical conduction between the chip and the contacts on the one hand and between the contacts and a read/write device on the other hand, chip card manufacturers wish to match the color of the contacts to the color or colors of the card. To this end, the contacts are generally covered either with a layer of gold, to obtain a golden finish, or with a layer of silver or palladium, to obtain a silver finish.

To obtain more colors, it is possible to use a method such as is described in document U.S. Pat. No. 6,259,035B1. This method is based on the use of solutions based on gold, palladium or silver to obtain a wider spectrum of colors.

An object of the invention is to produce flexible printed circuits comprising conductive tracks that are visible on the finished product, having a white color or a color close to white (for example a metallic luster verging on white), while retaining electrical and mechanical properties suitable for use thereof in chip card contact modules.

To this end, according to the invention, an electrical circuit has been designed for the production of chip card modules, comprising the following arrangements.

It comprises a substrate and at least one conductive track. The substrate is a dielectric substrate, for example glass epoxy. Advantageously, this substrate is flexible. The conductive track is for example produced by photolithography. That is to say by bonding and laminating a layer of conductive material, for example copper or a copper alloy, to the substrate, into which layer patterns are then advantageously etched to produce one or more conductive tracks or lands which may be used for example as electrical contacts. Alternatively, the patterns are cut from a sheet of conductive material, for example copper or a copper alloy, before co-laminating them with a dielectric substrate (known as "leadframe" technology).

The conductive track may also comprise one or more layers of metalization (for example, of nickel, nickel-phosphorus, a cobalt-tungsten alloy, gold, silver, palladium or one of the alloys thereof), deposited before or after etching the patterns, or before or after cutting out the patterns. The conductive track comprises, on top of at least part of at least one of these layers, a visible surface layer made of a rhodium alloy deposited on the conductive track by electrodeposition, the concentration by weight of rhodium in the rhodium alloy being higher than or equal to 50%. Advantageously, at least one of the layers of metalization forms a barrier layer which makes it possible to limit or to prevent the diffusion of elements from the rhodium alloy into the underlying layers and/or into the underlying conductive track, and/or the metal of the conductive track (e.g. copper) into the layers deposited on it and in particular into the copper.

Rhodium confers a white appearance on the conductive track. More specifically, the surface layer of rhodium has a gray-white metallic appearance. It affords this layer a conductivity suitable for a good contact (pressure) connection between it and a connector, for example a connector of a chip card read/write device. However, its concentration by weight should advantageously be higher than or equal to 50% in order to retain the properties specific to rhodium and in particular good resistance to corrosion and the whiteness of the deposit.

The electrical circuit according to the invention advantageously comprises one or the other of the following characteristics considered independently of one another or in combination with one or more others:
  the rhodium alloy comprises ruthenium;
  it comprises a primer layer deposited on the barrier layer, and under the surface layer of the rhodium alloy, this primer layer comprising at least one of the metals, or at least one alloy of a metal, included in the following list: rhodium, ruthenium, palladium, silver and gold;
  the thickness of a primer layer is less than or equal to 15 nanometers; (in particular, there may not be a primer layer if the deposition of a layer—for example of gold—on the barrier layer on the face other than that on which the rhodium alloy is deposited is done quickly before this layer is overly passivated);
  the thickness of the layer of rhodium alloy is between 10 nanometers and 150 nanometers.

The invention also relates to an electronic module for a chip card obtained from the electrical circuit such as mentioned above, and to a method for manufacturing this electrical circuit, in particular for producing chip card modules.

Thus, the electronic module comprises an electrical circuit according to the invention, with a substrate and at least one conductive track forming a contact land that is electrically connected to the chip, in which the conductive track is at least partially covered with an electrodeposited layer of rhodium alloy, the concentration by weight of rhodium in the alloy being higher than 50%. Advantageously, the layer of rhodium alloy is electrodeposited on a barrier layer deposited on the conductive track, prior to the deposition of the surface layer of the rhodium alloy by electrodeposition, this barrier layer comprising at least one of the elements from the following list: pure nickel, nickel-phosphorus alloy and cobalt-tungsten alloy.

The manufacturing method comprises the following steps:

providing a substrate;

producing a conductive layer on the substrate, this conductive track being at least partially covered with a visible surface layer formed of a rhodium alloy, deposited by electrodeposition on the conductive track, the concentration by weight of rhodium in the rhodium alloy being higher than or equal to 50%. Advantageously, the layer of rhodium alloy is electrodeposited on a barrier layer deposited on the conductive track, prior to the deposition of the surface layer of the rhodium alloy by electrodeposition, this barrier layer comprising at least one of the elements from the following list: pure nickel, nickel-phosphorus alloy and cobalt-tungsten alloy.

The method according to the invention advantageously comprises one or the other of the following characteristics considered independently of one another or in combination with one or more others:

a primer layer is deposited on the barrier layer, prior to the deposition of the surface layer of the rhodium alloy by electrodeposition, this primer layer comprising at least one of the metals or at least one alloy of a metal included in the following list: rhodium, ruthenium, palladium, silver and gold;

the conductive track comprises a set of contacts produced by photolithography, the production of the contacts by photolithography taking place before the deposition of the surface layer of the rhodium alloy by electrodeposition;

the conductive track is produced by co-laminating a lead frame onto the substrate.

Figure 2:
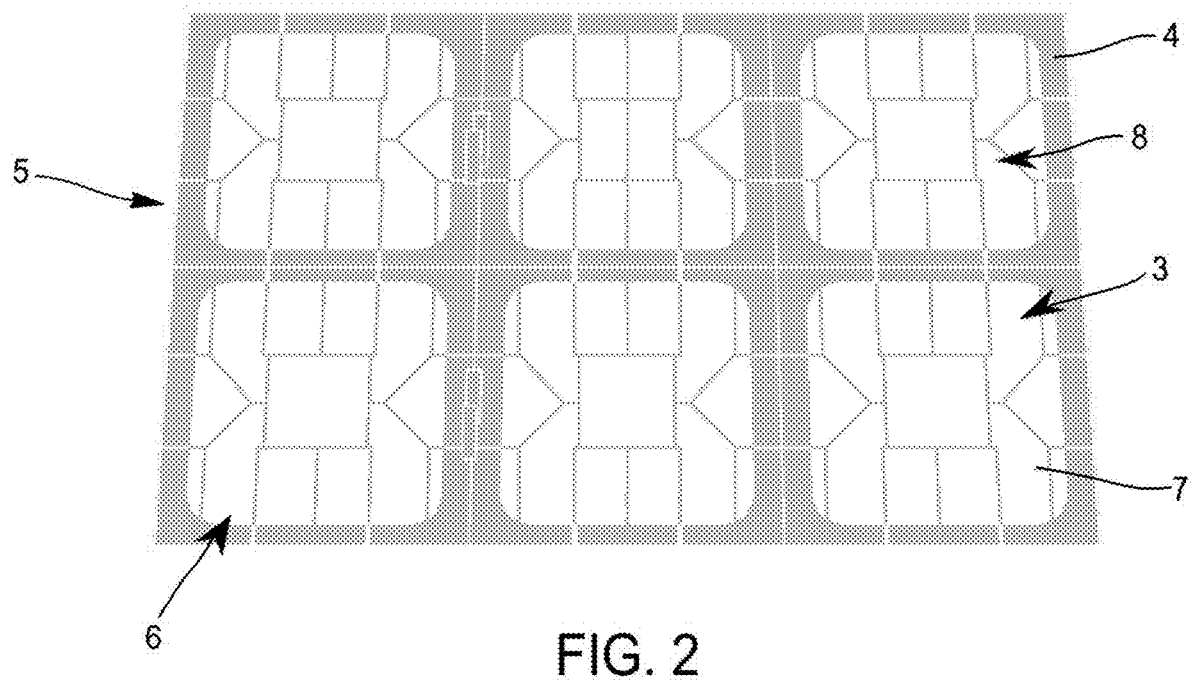
Figure 3:
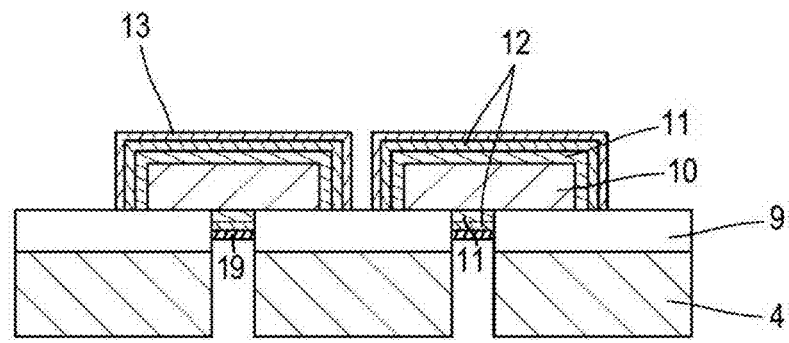
Figure 4A:
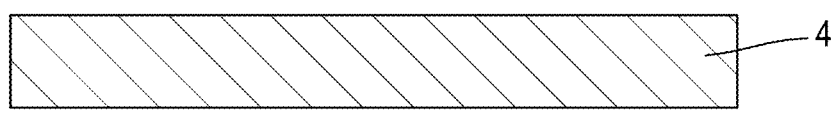
Figure 4B:
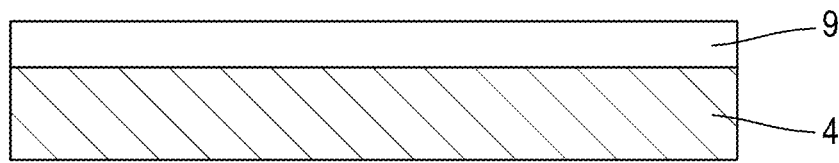
Figure 4C:
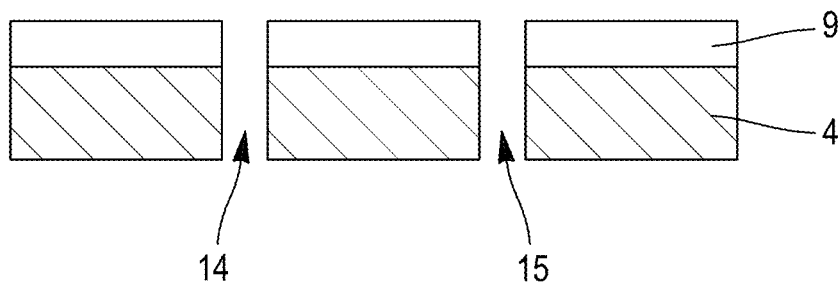
Figure 4D:
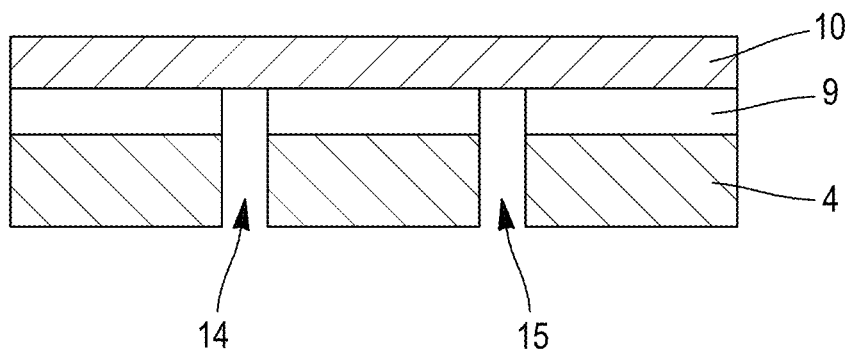
Figure 4E:
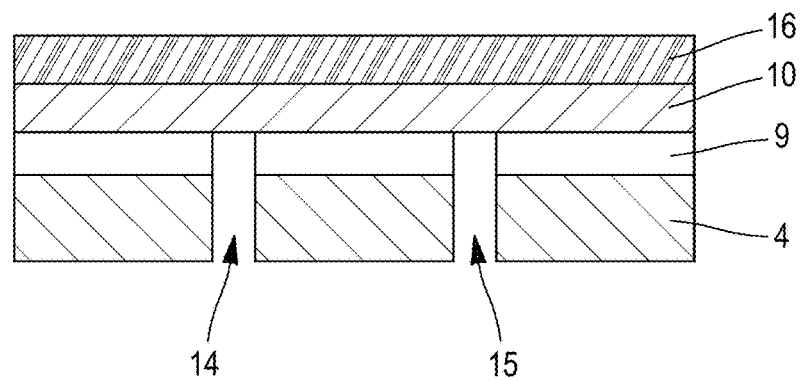
Figure 4F:
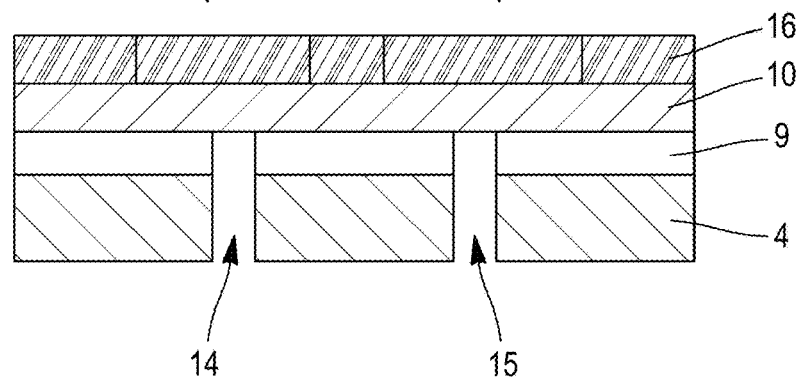
Figure 4G:
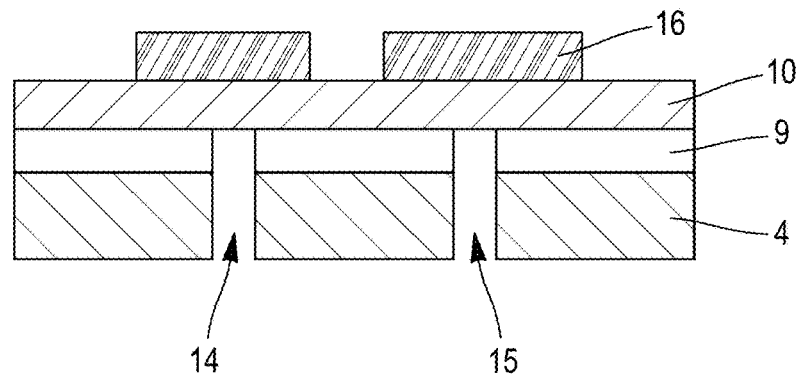
Figure 4H:
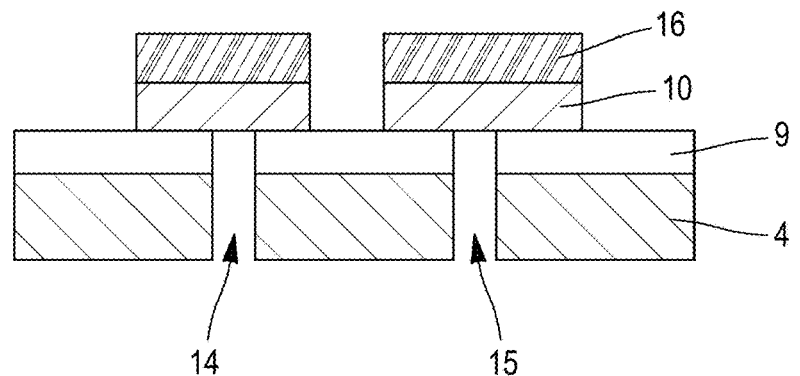
Figure 4I:
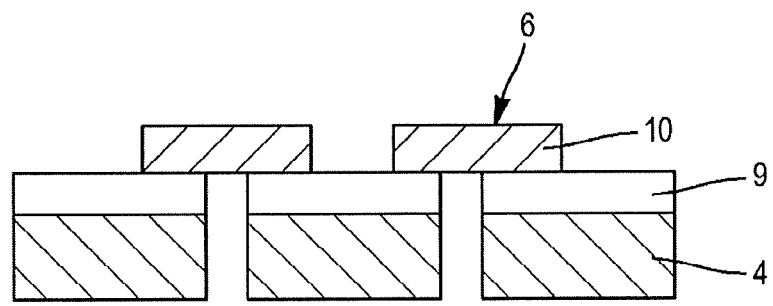
Figure 4J:
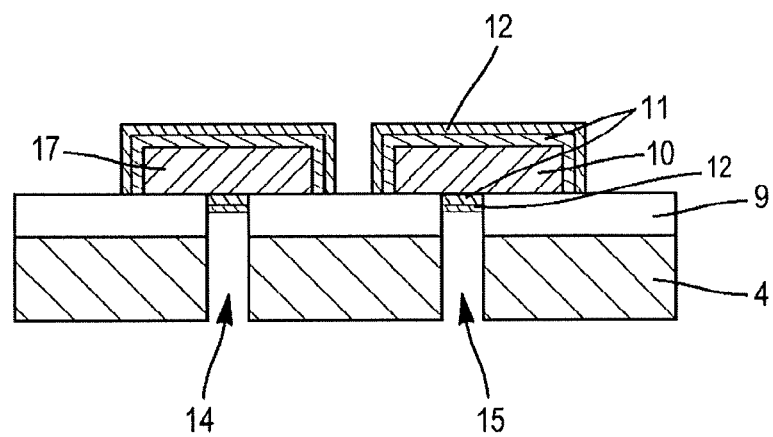
Figure 4K:
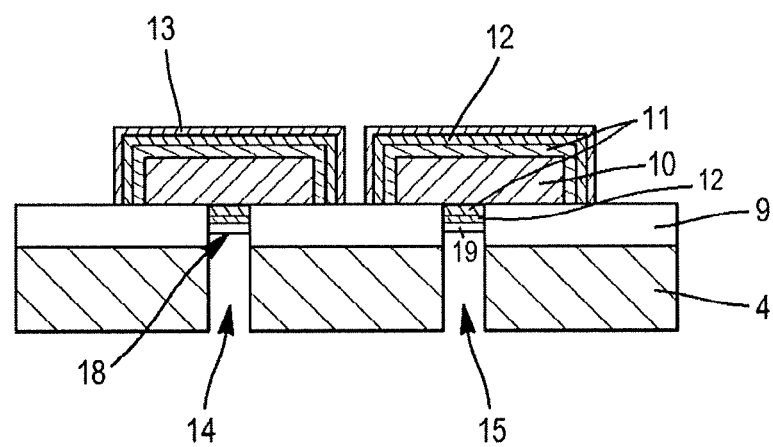
Figure 5:
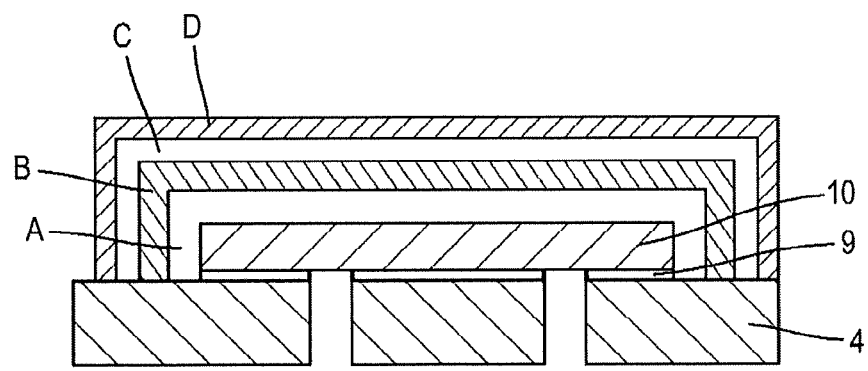

Other features and advantages of the invention will become apparent upon reading the detailed description and the appended drawings, in which:

FIG. 1 schematically shows, in perspective, a chip card comprising an example of a module according to the invention;

FIG. 2 schematically shows, from above, a portion of an electrical circuit according to the invention, comprising a plurality of connectors for a chip card module;

FIG. 3 partially and schematically shows, in cross section, an example of a connector for a module such as that shown in FIG. 1;

FIGS. 4a to 4k schematically show steps of an example of the implementation of the method according to the invention; and FIG. 5 schematically shows an example of stacked layers that may be obtained using the method according to the invention, the nature of the layers being specified in the table below.

In this document, an exemplary application of the electrical circuit according to the invention is taken from the field of chip cards, but a person skilled in the art will be able, without exercising inventive skill, to transpose this example to other electrical circuit applications. In particular, the invention is particularly advantageous in all cases where the conductive tracks will be visible on the finished product, as used by the consumer. For example, producing white-colored contacts for SD memory cards or USB keys can bring esthetic added value.

According to an exemplary application of the electrical circuit according to the invention, illustrated by FIG. 1, a chip card 1 comprises a module 2 with a connector 3. The module 2 is generally produced in the form of a separate element which is inserted into a cavity made in the card. This element comprises a generally flexible substrate 4 (see FIG. 2) of PET, glass epoxy, etc. on which the connector 3 is produced, to which a chip (not shown) is subsequently connected, via the face of the substrate opposite that comprising the connector 3.

FIG. 2 illustrates an example of a portion of an electrical circuit, here a printed circuit 5, with six connectors 3. Each connector 3 comprises a contact land 8 formed of conductive tracks 6. In the example illustrated here, eight electrical contacts 7 are formed from the conductive tracks 6.

More particularly, as shown in cross section in FIG. 3, a connector 3 (i.e. basically a module without a chip) has a multilayer structure formed of the substrate 4, of an adhesive layer 9, of a copper layer 10, of a nickel layer 11 (potentially actually composed of a first layer of pure nickel on which a second layer of nickel-phosphorus rests), of an optional primer layer 12 and finally of a layer of a rhodium alloy 13.

FIGS. 4a to 4k schematically illustrate different steps of an exemplary method according to the invention for manufacturing the connector 3. These steps comprise:

providing a substrate 4 (FIG. 4a);

coating one face of the substrate 4 with a layer of adhesive 9 (FIG. 4b);

perforating the substrate 4 provided with the layer of adhesive 9 in order to produce connection wells 14 and potentially a cavity 15 in which a chip will later be housed (FIG. 4c);

complexing the substrate 4 provided with the adhesive layer 9 with a conductive layer 10 such as a sheet of copper, aluminum or other, hot-crosslinking the adhesive layer 9 and deoxidizing the complex thus obtained (FIG. 4d);

laminating a dry film photoresist 16 (FIG. 4e) onto the conductive layer 10;

exposing the film photoresist 16 through a mask (FIG. 4f);

developing the film photoresist 16 (FIG. 4g);

chemically etching the conductive layer 10 in the regions not protected by the film photoresist 16 (FIG. 4h);

dissolving the film photoresist 16 (FIG. 4i);

metallizing the tracks of the conductive layer 17 obtained after etching, in one or more steps, to form the barrier layer 11 of nickel (or alloyed nickel), the potential primer layer 12 (FIG. 4j), and one or more potential layers (for example nickel 11 and gold 19) deposited at the bottom of the connection wells 14; and metallizing again to form a layer of rhodium alloy 13 (FIG. 4k). It should be noted that the potential layer of gold 19 may also be deposited after the rhodium alloy rather than before.

This last step is advantageously carried out by protecting, by masking, the back face 18 (i.e. the face intended not to be visible on the finished product). For this, a mask is applied to the face of the electrical circuit opposite that which accommodates the conductive tracks 6. Specifically, to obtain better solderability of the wires for connection to a chip, on the back face of the conductive tracks (opposite that referred to as the "front face" or "contact face", which is intended to receive the rhodium alloy), it may be advantageous to perform a selective metalization by applying a protective film or by applying a masking belt or else by using a selective metalization wheel on this face in the step of depositing the rhodium alloy. Thus, by virtue of selective masking, the possibility is retained of leaving gold as a surface layer on the back face for soldering the connection wires of the chip.

The layer of rhodium alloy 13 is deposited by (electrochemistry). Its thickness is between 10 nanometers and 150 nanometers. This thickness, along with the deposition conditions, make it possible to obtain a substantially clear deposit. The rhodium alloy is advantageously a rhodium-ruthenium alloy, in which the rhodium represents 50% or more, by weight, of the alloy. Increasing the ruthenium concentration decreases the cost of solutions for electrolytic baths, but leads to an alloy of darker color.

The rhodium alloy solution is for example a solution sold by Metalor® or Umicore®. Advantageously, this solution contains no sulfamic acid and/or practically no (i.e. the magnesium concentration is in all cases lower than 1 ppm) magnesium (for example in the form of magnesium sulfate).

The deposition is performed at a temperature of 55° C.+/−10° C., with a solution containing 5+8/−3 g/l of rhodium, between 0 and 0.5 g/l of ruthenium and a pH of less than 1. The rate of metalization is adjusted according to the number of electrolytic metalization cells used to produce the desired thickness of rhodium alloy. The current-density conditions are also adjusted according to the areas to be treated, the desired thicknesses and the composition of the desired alloy.

The layer of rhodium alloy obtained using the method according to the invention has good corrosion resistance meeting the specifications of the field and an electrical resistance lower than 500 mΩ.

The table below presents some examples of stacks of layers A to D (the layer A forming a barrier layer and the layers B and C being able to form primer layers) which may be produced, on a conductive layer 10 such as a sheet of copper, aluminum or other, using the method according to the invention (see FIG. 5—in FIG. 5, any metal layers deposited on the bank face are not shown):

| D | | | | Alloyed Rh | | | Alloyed Rh | Alloyed Rh | Alloyed Rh | Alloyed Rh | Alloyed Rh | | |
|---|---|---|---|---|---|---|---|---|---|---|---|---|---|
| C | | | Alloyed Rh | Pd | Alloyed Rh | | Pd | Pd | Alloyed Pd | Alloyed Au | Alloyed Au | Alloyed Rh | Alloyed Rh |
| B | Alloyed Rh | Alloyed Rh | Au or Ag | Au | | Au or Ag | Alloyed Rh | Au or Ag | Alloyed Au | Alloyed Au | Pd | Pd | Pd | Pd |
| A | Ag | Ni | Ni | Ni | | Alloyed Ni | Alloyed Ni | Alloyed Ni | Alloyed Ni | Alloyed Ni | Ni | Alloyed Ni | Alloyed Ni | Ni |

In the table above, nickel may be replaced with a cobalt-tungsten alloy.

According to a variant of the method described above, by producing a mask before the step of depositing the rhodium alloy, it is possible to produce patterns, such as logos, of gray-white color on a yellow background (underlying layer of gold, for example) or darker gray (underlying layer of palladium, silver or nickel, for example). Such patterns may also be produced for the purposes of graphical personalization or copy protection.

The invention claimed is:

1. An electrical circuit for producing chip card modules, comprising:
   a substrate and at least one conductive track, the at least one conductive track comprising contact lands configured for forming a chip card module connector, said contact lands being at least partially covered with a visible surface layer formed of a rhodium alloy, deposited by electrodeposition on the at least one conductive track,
   wherein a concentration by weight of rhodium in the rhodium alloy is higher than or equal to 50%, and
   wherein the rhodium alloy is deposited on at least one barrier layer deposited on the at least one conductive track, prior to the deposition of the surface layer of the rhodium alloy by electrodeposition, the at least one barrier layer comprising at least one element from the following list: pure nickel, nickel-phosphorus alloy, and cobalt-tungsten alloy.

2. The electrical circuit as claimed in claim 1, wherein the rhodium alloy comprises ruthenium.

3. The electrical circuit as claimed in claim 1, comprising a primer layer deposited on the at least one barrier layer, and under a surface layer of the rhodium alloy, the primer layer comprising at least one metal, or at least one alloy of a metal, included in the following list: rhodium, ruthenium, palladium, silver, and gold.

4. The electrical circuit as claimed in claim 3, wherein a thickness of the primer layer is less than or equal to 15 nanometers.

5. The electrical circuit as claimed in claim 1, wherein a thickness of the layer of rhodium alloy is between 10 nanometers and 150 nanometers.

6. An electronic module for a chip card, comprising an electrical circuit as claimed in claim 1, with a substrate and at least one conductive track forming a contact land that is electrically connected to the chip, wherein the at least one conductive track is at least partially covered with a layer of rhodium alloy, the concentration by weight of rhodium in the alloy being higher than 50%, the layer of rhodium alloy being electrodeposited on a barrier layer deposited on the conductive track, prior to the deposition of the surface layer of the rhodium alloy by electrodeposition, the barrier layer comprising at least one element from the following list: pure nickel, nickel-phosphorus alloy, and cobalt-tungsten alloy.

7. A method for manufacturing an electrical circuit for producing chip card modules, comprising the following steps:

providing a substrate;
   producing a conductive track that at least partially covers the substrate, the conductive track comprising contact lands configured for forming a chip card module connector, said contact lands being at least partially covered with a visible surface layer made of a rhodium alloy, deposited by electrodeposition on the at least one conductive track,
   wherein a concentration by weight of rhodium in the rhodium alloy is higher than or equal to 50%, and
   wherein the layer of rhodium alloy is electrolytically deposited at least partly on a barrier layer comprising at least one material from the list consisting of pure nickel, a nickel-phosphorus alloy, and a cobalt-tungsten alloy.

8. The method as claimed in claim 7, wherein a primer layer is deposited on the barrier layer, prior to the deposition of the surface layer of the rhodium alloy by electrodeposition, the primer layer comprising at least one of the metals or at least one alloy of a metal included in the following list: rhodium, ruthenium, palladium, silver, and gold.

9. The method as claimed in claim 7, wherein the conductive track comprises a set of contacts made by photolithography, before the deposition of the surface layer of the rhodium alloy by electrodeposition.

10. The method as claimed in claim 7, wherein the conductive track is produced by co-laminating a lead frame onto the substrate.

11. The method as claimed in claim 7, wherein the face of the substrate opposite that which is at least partially covered with the conductive layer is at least partially masked.

* * * * *